United States Patent
Ben Amar Baranga et al.

(10) Patent No.: US 10,712,407 B2
(45) Date of Patent: Jul. 14, 2020

(54) DEVICE AND METHODOLOGY FOR MEASURING MINUTE CHANGES IN AMBIENT MAGNETIC FIELD

(71) Applicant: BEN GURION UNIVERSITY OF THE NEGEV RESEARCH AND DEVELOPMENT AUTHORITY, Beer Sheva (IL)

(72) Inventors: Andrei Ben Amar Baranga, Omer (IL); David Levron, Omer (IL); Eugene Paperno, Beer Sheva (IL); Reuben Shuker, Omer (IL)

(73) Assignee: BEN GURION UNIVERSITY OF THE NEGEV RESEARCH AND DEVELOPMENT AUTHORITY, Beer Sheva (IL)

( * ) Notice: Subject to any disclaimer, the term of this patent is extended or adjusted under 35 U.S.C. 154(b) by 738 days.

(21) Appl. No.: 14/766,250

(22) PCT Filed: Feb. 3, 2014

(86) PCT No.: PCT/IL2014/050113
§ 371 (c)(1),
(2) Date: Aug. 6, 2015

(87) PCT Pub. No.: WO2014/122644
PCT Pub. Date: Aug. 14, 2014

(65) Prior Publication Data
US 2015/0377989 A1    Dec. 31, 2015

Related U.S. Application Data

(60) Provisional application No. 61/814,378, filed on Apr. 22, 2013, provisional application No. 61/761,752, filed on Feb. 7, 2013.

(51) Int. Cl.
*G01R 33/26* (2006.01)
*G01R 33/032* (2006.01)

(52) U.S. Cl.
CPC ............ *G01R 33/26* (2013.01); *G01R 33/032* (2013.01)

(58) Field of Classification Search
CPC ............................. G01R 33/032; G01R 33/26
(Continued)

(56) References Cited

U.S. PATENT DOCUMENTS

| 5,189,368 A * | 2/1993 | Chase | G01R 33/26 324/304 |
| 5,436,561 A * | 7/1995 | Leger | G01R 33/26 324/304 |

(Continued)

FOREIGN PATENT DOCUMENTS

WO    2009073256    6/2009

OTHER PUBLICATIONS

Belfi et al.; "Dual channel self-oscillating optical magnetometer"; Apr. 3, 2009; Journal of the Optical Society of America; vol. 26, No. 5; p. 910-916.*

(Continued)

*Primary Examiner* — Melissa J Koval
*Assistant Examiner* — Rahul Maini
(74) *Attorney, Agent, or Firm* — The Roy Gross Law Firm, LLC; Roy Gross

(57) ABSTRACT

An optical magnetometer comprising: a response frequency measurement unit comprising a vapor cell, a pulsed-mode pump laser and a probe laser; and a computing unit configured to compute a magnetic field change based on a difference between at least two temporally-distinct response fre- (Continued)

quency values received from the frequency measurement unit. Optionally, the response frequency measurement unit is magnetically non-shielded.

17 Claims, 4 Drawing Sheets

(58) Field of Classification Search
USPC ...................................... 324/304, 244, 244.1
See application file for complete search history.

(56) References Cited

U.S. PATENT DOCUMENTS

| | | | |
|---|---|---|---|
| 8,212,556 B1* | 7/2012 | Schwindt | G01R 33/26 |
| | | | 324/304 |
| 8,289,018 B2* | 10/2012 | Narducci | G01R 33/022 |
| | | | 324/301 |
| 8,587,304 B2* | 11/2013 | Budker | G01R 33/26 |
| | | | 324/304 |
| 2005/0206377 A1 | 9/2005 | Romalis et al. | |
| 2006/0033494 A1 | 2/2006 | Hennig et al. | |
| 2010/0225313 A1* | 9/2010 | Blanz | G01R 33/26 |
| | | | 324/304 |
| 2011/0025323 A1* | 2/2011 | Budker | G01R 33/26 |
| | | | 324/304 |
| 2011/0101972 A1 | 5/2011 | Narducci et al. | |

OTHER PUBLICATIONS

Bevilacqua et al.; "All-optical magnetometry for NMR detection in a micro-Tesla field and unshielded environment"; Sep. 22, 2009; Journal of Magnetic Resonance; vol. 210; p. 222-220.*

* cited by examiner

DEVICE AND METHODOLOGY FOR MEASURING MINUTE CHANGES IN AMBIENT MAGNETIC FIELD

CROSS REFERENCE TO RELATED APPLICATIONS

This patent application is a U.S. National Phase filing of commonly owned PCT Application No. PCT/IL2014/050113, filed Feb. 3, 2014, which is based on and claims the benefit of the filing date of U.S. Provisional Patent Application Ser. No. 61/761,752, filed Feb. 7, 2013, and U.S. Provisional Patent Application Ser. No. 61/814,378, filed Apr. 22, 2013, all which are incorporated herein by reference in their entirety.

FIELD OF THE INVENTION

The invention relates to the field of optical magnetometers.

BACKGROUND

Optical magnetometers are used for the accurate measurement of magnetic fields. These magnetometers utilize a phenomenon known as Larmor precession, in which metal atom spins have a precession at a frequency proportional to the ambient magnetic field. The atoms are optically pumped by a pump laser beam, and their spin rotation frequency is measured by a probe laser beam. Usually, these magnetometers are used to measure absolute values of certain magnetic fields in a controlled environment and thus, they are often magnetically shielded to avoid the effect of external interferences (e.g. the earth's magnetic field). They are also commonly big and expensive, due to the laser components and shielding they comprise.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

On embodiment provides an optical magnetometer comprising: a response frequency measurement unit comprising a vapor cell, a pulsed-mode pump laser and a probe laser; and a computing unit configured to compute a magnetic field change based on a difference between at least two temporally-distinct response frequency values received from the response frequency measurement unit.

In some embodiments, said response frequency measurement unit is magnetically shielded.

In some embodiments, said response frequency measurement unit is magnetically non-shielded.

In some embodiments, said vapor cell comprises alkaline atoms.

In some embodiments, said alkaline atoms are selected from the group consisting of Cesium (Cs), Rubidium (Rb) and Potassium (K).

In some embodiments, said response frequency measurement unit further comprises an oven configured to control a temperature in said vapor cell.

In some embodiments, said pump laser comprises a pulse diode laser configured to emit a pulsating laser beam.

In some embodiments, said pump laser further comprises a diffraction grating configured to tune the pulsating laser beam.

In some embodiments, said response frequency measurement unit further comprises an optical delivery system and a polarimeter system.

In some embodiments, said pump laser further comprises a linear polarizer configured to filter the pulsating laser beam.

In some embodiments, said pump laser further comprises a circular polarizer configured to circularly polarize the pulsating laser beam.

In some embodiments, said circular polarizer is a $\lambda/4$ quarter wave plate.

In some embodiments, said probe laser comprises a single mode diode laser.

In some embodiments, said probe laser further comprises a linear polarizer.

In some embodiments, said response frequency measurement unit further comprises a polarized splitter configured to split a beam transmitted by said probe laser.

In some embodiments, said response frequency measurement unit further comprises multiple photodiodes, such that light of different polarizations is transferred to different ones of the multiple photodiodes from said polarized splitter, resulting in the at least two temporally-distinct response frequency values.

Another embodiment provides a method for measuring change in a magnetic field, the method comprising computing a difference between at least two temporally-distinct response frequency values received from a pulsed-mode atomic magnetometer.

In some embodiments, said computing is performed by a hardware computing unit.

In some embodiments, said pulsed-mode atomic magnetometer comprises a magnetically-shielded response frequency measurement unit.

In some embodiments, said pulsed-mode atomic magnetometer comprises a magnetically non-shielded response frequency measurement unit.

In some embodiments, said pulsed-mode atomic magnetometer comprises a response frequency measurement unit comprising a vapor cell, a pulsed-mode pump laser and a CW (continuous wave) laser probe.

In some embodiments, the method further comprises irradiating said vapor cell with a pulsating laser beam from the pulsed-mode pump laser.

In some embodiments, the method further comprises tuning the pulsating laser beam using a diffraction grating.

In some embodiments, the method further comprises directing the pulsating laser beam using an optical delivery system.

In some embodiments, the method further comprises filtering the pulsating laser beam using a linear polarizer.

In some embodiments, the method further comprises circularly polarizing the pulsating laser beam using a $\lambda/4$ quarter wave plate.

In some embodiments, said probe laser comprises a single mode diode laser.

In some embodiments, the method further comprises emitting a continuous-wave laser beam from said single mode diode laser through said vapor cell.

In some embodiments, the method further comprises filtering the continuous-wave laser beam using a linear polarizer.

In some embodiments, the method further comprises splitting the continuous-wave laser beam using a polarized splitter.

In some embodiments, the split probe laser beam impinges on multiple photodiodes of said response frequency measurement unit.

In some embodiments, the at least two temporally-distinct response frequency values are obtained as a voltage difference between said multiple photodiodes.

A further embodiment provides a method for measuring a change in a magnetic field, the method comprising: irradiating a vapor cell with pulsed laser light while a magnetic field changes; measuring at least two temporally-distinct responses to the irradiation; and determining an amount of change to the magnetic field based on a difference between the at least two responses.

In some embodiments, said irradiating is at a repetition rate of 5 KHz or less.

In some embodiments, the non-shielded optical magnetometer is capable of measuring changes to the ambient magnetic field in the order of a few pT (pico Tesla).

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

An atomic magnetometer is disclosed herein. The atomic magnetometer includes a response frequency measurement unit having a vapor cell, a pulsed-mode pump laser and a laser probe. The atomic magnetometer further includes a computing unit configured to compute a magnetic field change based on a difference between response frequency values of at least two temporally-distinct measurements, utilizing the Larmor frequency phenomenon associated with atoms in the vapor cell. Optionally, the response frequency measurement unit is magnetically non-shielded, but nonetheless capable of measuring magnetic field changes, such as those associated with a body of metal passing by the magnetometer, at pT sensitivity.

Advantageously, the present atomic magnetometer, which utilizes a relatively simple, cheap and small pulsed-mode pump laser, may provide a solution to many of today's prominent magnetometer needs.

A method for measuring a magnetic field change, in accordance with some embodiments, may include computing a difference between response frequency values of at least two measurements, utilizing the Larmor frequency phenomenon associated with the vapor cell. In the method, a vapor cell is irradiated with pulsed laser light while the ambient magnetic field changes and at least two temporally-distinct responses to the irradiation are recorded. The amount of change to the magnetic field is then computed based on a difference between each of the at least two frequency responses.

Figure 1:
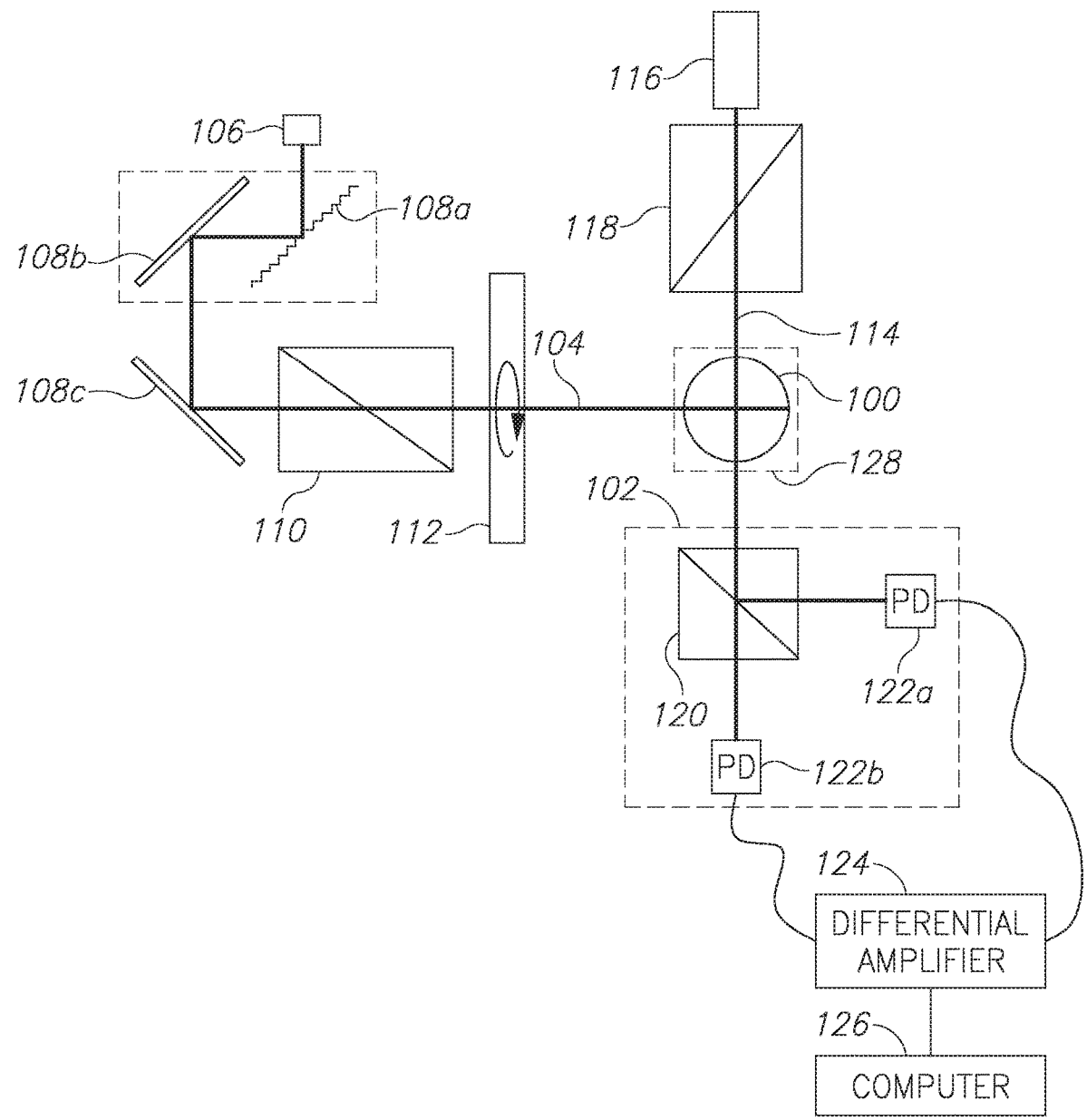
FIG. 1 shows a block diagram of an exemplary atomic magnetometer.

The present atomic magnetometer may be better understood with reference to the accompanying drawings. Reference is now made to FIG. 1, which shows a block diagram of an optical magnetometer, in accordance with an embodiment. In this example, the optical magnetometer is of the atomic type Alkaline atoms (such as Cs, Rb and/or K) are contained in a vapor cell (100) which may be temperature-controlled by an oven (128). A pulsating laser beam (104) may be generated by a pulse diode laser (106), tuned by a diffraction grating (108a), directed by an optical delivery system (for example including one or more mirrors 108b, 108c, one or more optical fibers, etc.), optionally filtered by a linear polarizer (110) and circularly polarized by a circular polarizer being a λ/4 quarter wave plate (112), which finally optically pumps the atoms in vapor cell (100). In an ambient magnetic field, the atom spins have a precession at a Larmor frequency, proportional to the ambient magnetic field intensity.

A probe laser beam (114), optionally generated by a single mode diode laser (116) and filtered by a linear polarizer (118), may pass through the vapor cell (100). The probe laser is optionally a CW (continuous wave) probe laser, or a pulsed probe laser.

The probe beam linear polarization rotates due to the ambient magnetic field. Time-dependent polarization may be measured by a polarimeter or by a balanced polarimeter (102), which may include a polarizing beam splitting cube (120) and multiple, for example two, photodiodes (122a, 122b). The probe beam (114) may be split by polarizing beam splitting cube (120) to fall on photodiodes (122a, 122b). Due to the rotation of the probe beam polarization, a different light intensity is transferred to and impinges on each of the photodiodes (122a, 122b), namely—the intensity transferred to photodiode 122a is maximal when the intensity transferred to photodiode 122b is minimal, and vice versa. The photodiodes (122a, 122b) may produce voltage which is equivalent to the intensity of light projected onto them. The voltage difference between them may then be amplified by a differential amplifier (124) to yield the result, which is processed by a computing unit (126) for further calculations. Computing unit (126) may include hardware such as a microprocessor, an integrated circuit and/or a discrete electronic circuit, configured to compute a magnetic field change based on the voltage difference between the photodiodes, namely—between at least two temporally-distinct response frequency values.

The present optical magnetometer may accurately measure small changes in the ambient magnetic field, at a pT sensitivity. It does so by launching the pump laser beam (104) towards an advantageously unshielded vapor cell (100) at a repetition rate of, for example, up to about 5 KHz, constantly measuring the probe beam (114) rotation, and calculating the frequency offset between measurements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

Experimental Results 1

In an experiment conducted, a 70 nT (nano-Tesla) magnetic field was applied to a shielded vapor cell which included 99% Rb and 1% K. The pump beam wavelength was tuned to 795 nm (Rb D1 line) and the probe beam was tuned to 770 nm (K D1 line). The magnetic field was slightly changed, and the system then measured the magnetic field change.

Figure 2:
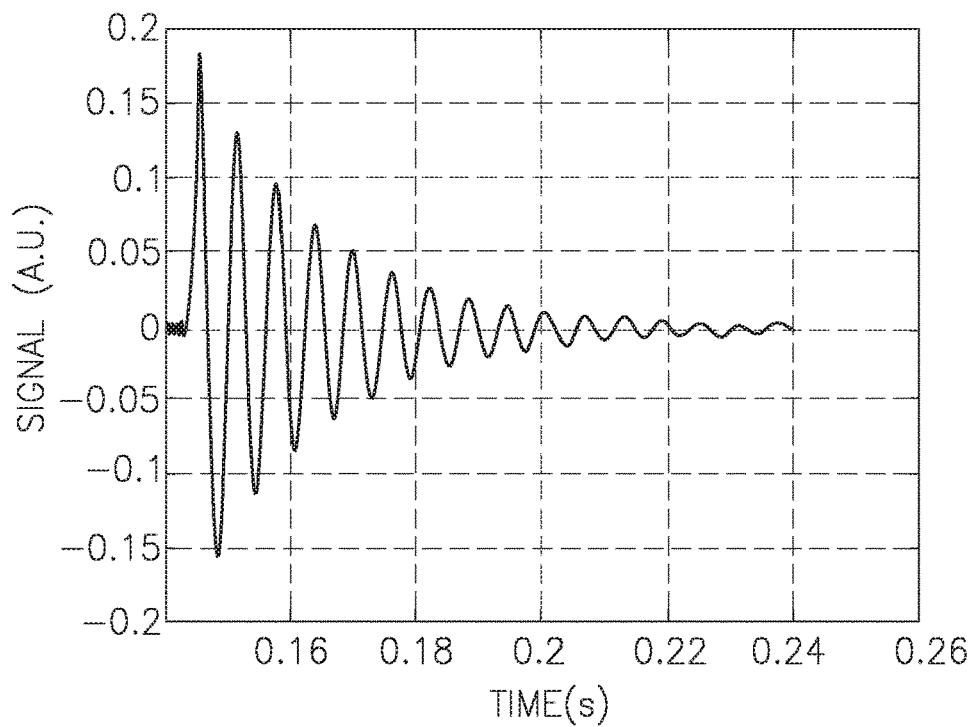
FIG. 2 shows a graph of a response to a short pulse of a pump laser, in the course of a shielded experiment.

Referring now to FIG. 2, the system response to a short pulse (200 ns) of the pump laser is shown. The measured frequency of the decaying oscillations is 162.4 Hz. Knowing the Potassium atoms Larmor frequency, which is a 233,333 Hz/Gauss (or 2.333 Hz/nT), one concludes a magnetic field of 69.57 nT.

To extract the frequency shift between measurements, the sum of absolute values of difference of the spectra, taken at all sampling points, was calculated.

Figure 3:
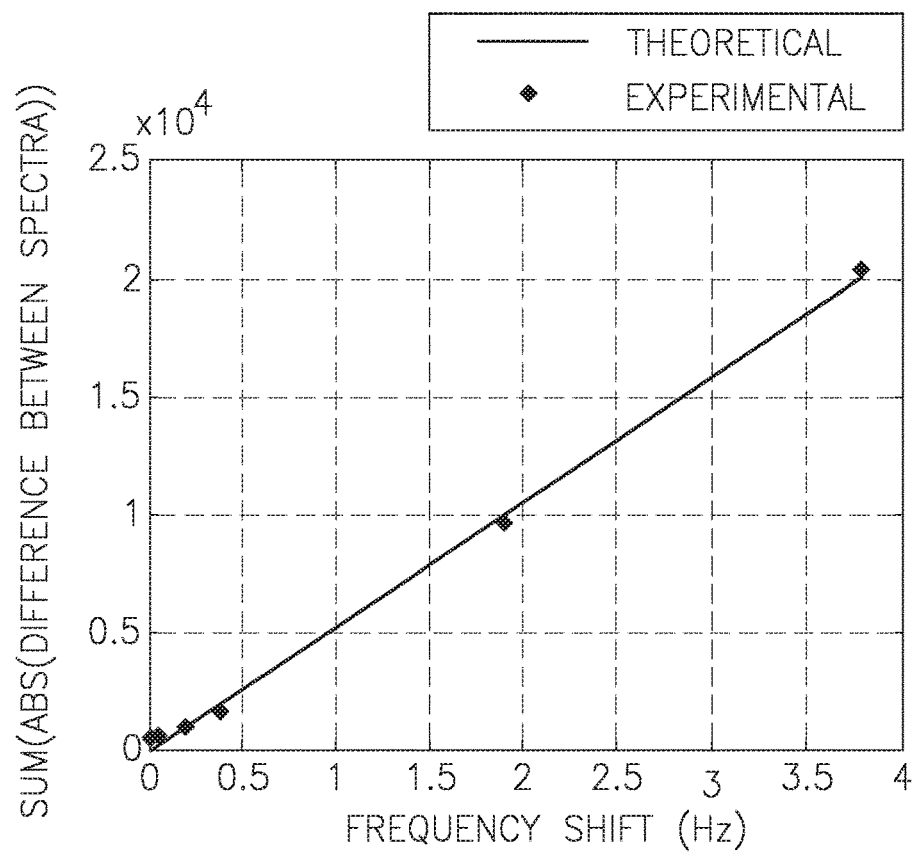
FIG. 3 shows a graph of the fit between a theoretical curve and measured experiment results in the course of a shielded experiment.

Five additional measurements were taken, with a magnetic field change of $\Delta=16.2$ pT (equivalent to 0.038 Hz frequency shift), $5\Delta$, $10\Delta$, $50\Delta$, and $100\Delta$. In addition, a simulation of these five measurements was performed and compared with the real measured results. FIG. 3 shows the simulation and measurements results. The fit between the theoretical curve and measured result starts to be adequate at about 0.08 Hz, which is equivalent to ~34 pT. Thus, this experimental system can measure magnetic field changes at a sensitivity of ~34 pT.

Experimental Results 2

Figure 4:
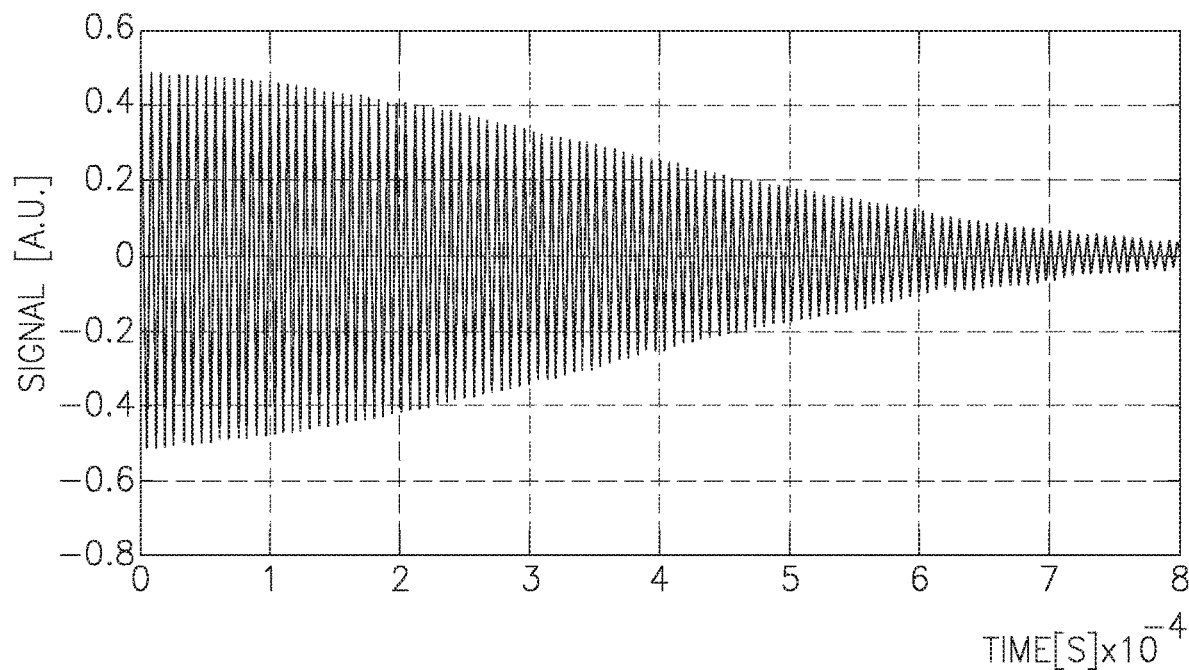
FIG. 4 shows a graph of a response to a short pulse of a pump laser in the course of an unshielded experiment, under influence of the earth magnetic field.
Figure 5:
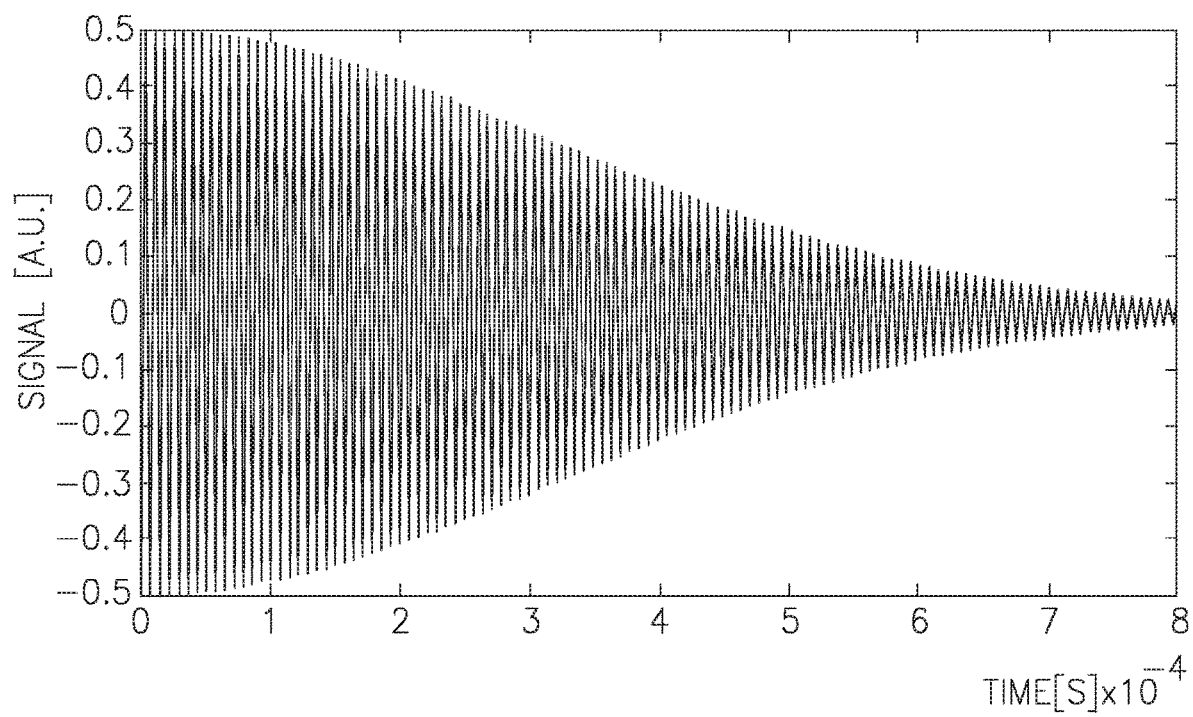
FIG. 5 shows a graph of a response to a short pulse of a pump laser in the course of an unshielded experiment, under influence of slight change in the earth magnetic field.

An additional experiment was performed, this time without shielding, using a Cs cell. The pump was tuned to 895 nm and the probe was tuned to near 852 nm Referring to FIG. 4, the response of the system to a short pulse of pump light is depicted. The spectrum represents decaying oscillations at approximately 148 kHz. The ambient earth field at the laboratory is approximately 0.395 Gauss (39500 nT). The magnetic field that corresponds to 1 Hz is 266 pT. The fit to the experimental spectrum is shown in FIG. 5.

The operation was repeated with small changes in the magnetic field. The response of the system looks similar to the one depicted in FIG. 4, with a small frequency change. A measure of the frequency change was determined as the sum of the absolute values of the difference between the fits to the spectra, taken at all sampling points.

Figure 6:
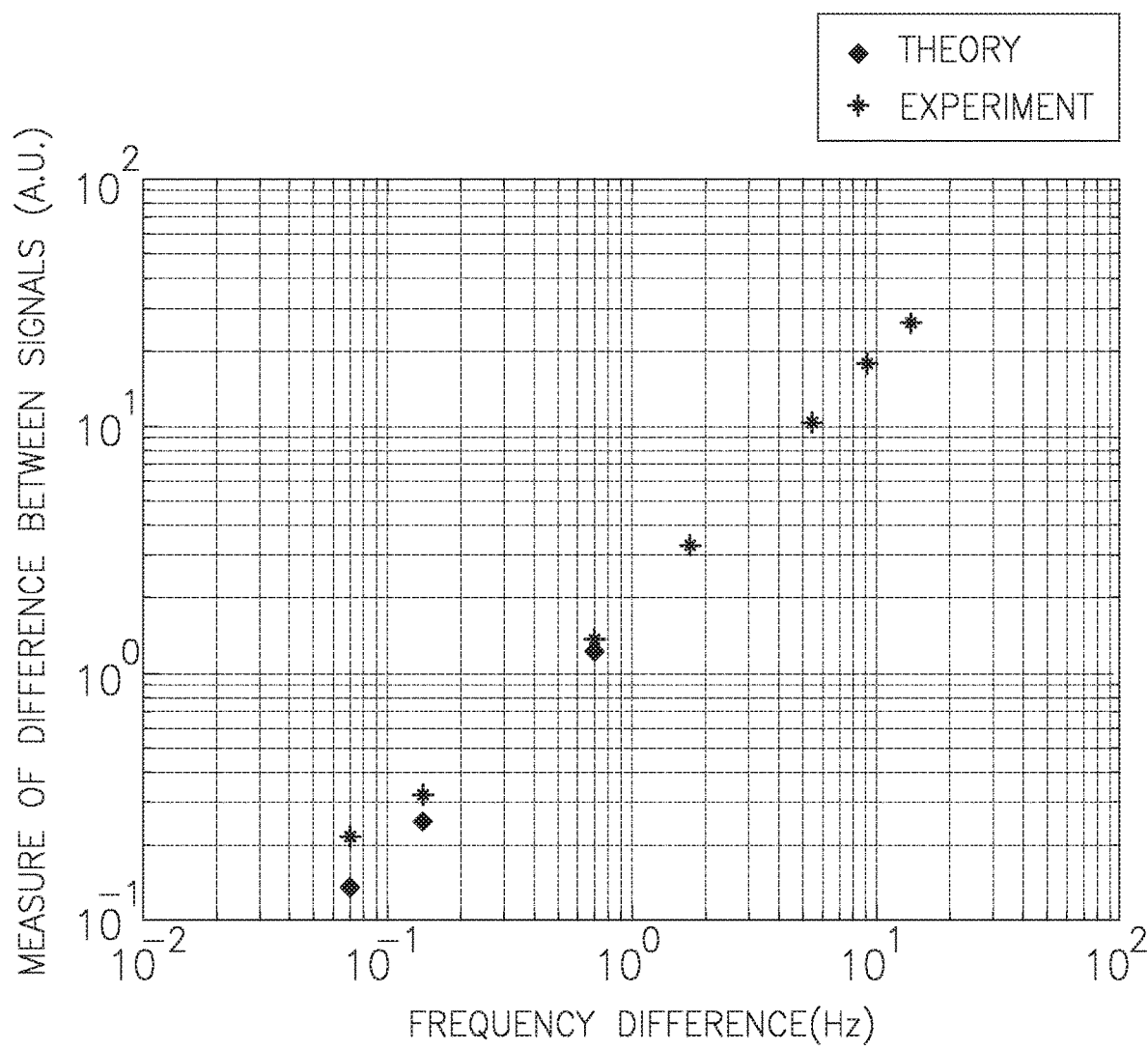
FIG. 6 shows a graph of the fit between a theoretical curve and measured experiment results in the course of an unshielded experiment.

Referring to FIG. 6, the results of several measurements are depicted. The difference of the frequency between measurements is calculated by comparing the fits to the spectra using the sum of absolute differences between the fits at all sampling points. As shown, frequency differences of 0.1 Hz may be detected. This corresponds to approximately 27 pT. Further improvement of the signal-to-noise ratio may result in better accuracy, namely <5 pT.

What is claimed is:

1. An optical magnetometer comprising:
   a response frequency measurement unit comprising a vapor cell, a pulsed diode pump laser and a probe laser; and
   a computing unit configured to compute a magnetic field change within an ambient magnetic field based on a difference between at least two temporally distinct response frequency values received from the response frequency measurement unit;
   wherein at least said vapor cell of said response frequency measurement unit is magnetically exposed to said ambient magnetic field, said ambient magnetic field being the magnetic field of the Earth; and
   wherein said pulsed diode pump laser is configured to effect decaying oscillations within said vapor cell following generation of a single pulse of 200 ns or less.

2. The optical magnetometer according to claim 1, wherein said vapor cell comprises alkaline atoms.

3. The optical magnetometer according to claim 2, wherein said alkaline atoms are selected from the group consisting of Cesium (Cs), Rubidium (Rb) and Potassium (K).

4. The optical magnetometer according to claim 2, wherein said response frequency measurement unit further comprises an oven configured to control a temperature in said vapor cell.

5. The optical magnetometer according to claim 1, wherein said pulsed diode pump laser emits a pulsating laser beam.

6. The optical magnetometer according to claim 5, wherein said pulsed diode pump laser further comprises a diffraction grating configured to tune the pulsating laser beam.

7. The optical magnetometer according to claim 6, wherein said response frequency measurement unit further comprises an optical delivery system and a polarimeter system.

8. The optical magnetometer according to claim 5, wherein said pulsed diode pump laser further comprises a linear polarizer configured to filter the pulsating laser beam.

9. The optical magnetometer according to claim 5, wherein said pulsed diode pump laser further comprises a circular polarizer configured to circularly polarize the pulsating laser beam.

10. The optical magnetometer according to claim 9, wherein said circular polarizer is a $\lambda/4$ quarter wave plate.

11. The optical magnetometer according to claim 1, wherein said probe laser comprises a single mode diode laser.

12. The optical magnetometer according to claim 11, wherein said probe laser further comprises a linear polarizer.

13. The optical magnetometer according to claim 1, wherein said response frequency measurement unit further comprises a polarized splitter configured to split a beam transmitted by said probe laser.

14. The optical magnetometer according to claim 13, wherein said response frequency measurement unit further comprises multiple photodiodes, such that light of different polarizations is transferred to different ones of the multiple photodiodes from said polarized splitter, resulting in the at least two temporally-distinct response frequency values.

15. A method for measuring change in an ambient magnetic field, the method comprising
   placing in an ambient magnetic field of the earth a pulsed atomic magnetometer comprising a response frequency measurement unit comprising a vapor cell, a pulsed diode pump laser and a continuous wave (CW) probe laser, magnetically exposing at least said vapor cell of said response frequency measurement unit to said ambient magnetic field of the earth;
   generating a single pulse from said pulsed diode pump laser; and
   computing a difference between at least two temporally-distinct response frequency values received from said pulsed atomic magnetometer, wherein said computing is performed by a hardware computing unit.

16. A method for measuring a change in a magnetic field, the method comprising:
- placing in an ambient magnetic field of the earth a pulsed atomic magnetometer comprising a response frequency measurement unit comprising a vapor cell, a pulsed diode pump laser and a continuous wave (CW) probe laser;
- magnetically exposing at least said vapor cell of said response frequency measurement unit to said ambient magnetic field of the earth;
- irradiating said vapor cell with a single pulse from said pulsed diode pump laser, and while a magnetic field changes;
- measuring at least two temporally distinct responses from said vapor cell to the irradiation; and
- determining an amount of change to the ambient magnetic field based on a difference between the at least two responses.

17. The method according to claim 16, wherein said irradiating is at a repetition rate of 5 KHz or less.